US008377761B2

(12) United States Patent
Gehring et al.

(10) Patent No.: US 8,377,761 B2
(45) Date of Patent: Feb. 19, 2013

(54) SOI DEVICE HAVING A SUBSTRATE DIODE WITH PROCESS TOLERANT CONFIGURATION AND METHOD OF FORMING THE SOI DEVICE

(75) Inventors: Andreas Gehring, Dresden (DE); Jan Hoentschel, Dresden (DE); Andy Wei, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 13/081,575

(22) Filed: Apr. 7, 2011

(65) Prior Publication Data

US 2011/0183477 A1    Jul. 28, 2011

Related U.S. Application Data

(62) Division of application No. 11/862,296, filed on Sep. 27, 2007, now Pat. No. 7,943,442.

(30) Foreign Application Priority Data

Jan. 31, 2007    (DE) .................... 10 2007 004 859

(51) Int. Cl.
*H01L 21/84*    (2006.01)
(52) U.S. Cl. ........ 438/153; 438/149; 438/150; 438/151; 438/152; 257/350; 257/347; 257/E21.7
(58) Field of Classification Search .......... 438/151, 438/152, 153, 150, 149; 257/E21.7, 350, 257/347
See application file for complete search history.

(56) References Cited

U.S. PATENT DOCUMENTS

| | | | |
|---|---|---|---|
| 6,407,429 B1 | 6/2002 | Ko et al. | 257/350 |
| 6,573,172 B1 * | 6/2003 | En et al. | 438/626 |
| 6,693,325 B1 | 2/2004 | Ko et al. | 257/347 |
| 6,835,662 B1 | 12/2004 | Erhardt et al. | 438/689 |
| 7,473,623 B2 * | 1/2009 | Chen et al. | 438/585 |
| 2003/0186508 A1 | 10/2003 | Kim | 438/303 |
| 2005/0184341 A1 | 8/2005 | Wei et al. | 257/347 |
| 2005/0269642 A1 | 12/2005 | Minami | 257/355 |
| 2006/0258110 A1 | 11/2006 | Pelella | 438/311 |

FOREIGN PATENT DOCUMENTS

WO    WO 2006/124182    11/2006

OTHER PUBLICATIONS

PCT Search Report and Written Opinion from PCT/US2008/001310 dated Dec. 18, 2008.

* cited by examiner

*Primary Examiner* — Thinh T Nguyen
(74) *Attorney, Agent, or Firm* — Williams, Morgan & Amerson, P.C.

(57) ABSTRACT

A substrate diode for an SOI device is formed in accordance with an appropriately designed manufacturing flow, wherein transistor performance enhancing mechanisms may be implemented substantially without affecting the diode characteristics. In one aspect, respective openings for the substrate diode may be formed after the formation of a corresponding sidewall spacer structure used for defining the drain and source regions, thereby obtaining a significant lateral distribution of the dopants in the diode areas, which may therefore provide sufficient process margins during a subsequent silicidation sequence on the basis of a removal of the spacers in the transistor devices. In a further aspect, in addition to or alternatively, an offset spacer may be formed substantially without affecting the configuration of respective transistor devices.

20 Claims, 7 Drawing Sheets

SOI DEVICE HAVING A SUBSTRATE DIODE WITH PROCESS TOLERANT CONFIGURATION AND METHOD OF FORMING THE SOI DEVICE

CROSS-REFERENCE TO RELATED APPLICATION

This is a divisional of application Ser. No. 11/862,296, filed Sep. 27, 2007 now U.S. Pat. No. 7,943,442.

BACKGROUND OF THE INVENTION

1. Field of the Invention

Generally, the present disclosure relates to the formation of integrated circuits, and, more particularly, to substrate diodes of complex SOI circuits, which may be used for thermal sensing applications and the like.

2. Description of the Related Art

The fabrication of integrated circuits requires a large number of circuit elements, such as transistors and the like, to be formed on a given chip area according to a specified circuit layout. Generally, a plurality of process technologies are currently practiced, wherein, for complex circuitry, such as microprocessors, storage chips, ASICs (application specific ICs) and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the latter aspect renders the reduction of the channel length, and associated therewith the reduction of the channel resistivity, a dominant design criterion for accomplishing an increase in the operating speed of the integrated circuits.

In view of the former aspect, in addition to other advantages, the semiconductor or silicon on insulator (SOI) architecture has continuously been gaining in importance for manufacturing MOS transistors, due to their characteristics of a reduced parasitic capacitance of the PN junctions, thereby allowing higher switching speeds compared to bulk transistors. In SOI transistors, the semiconductor region, in which the drain and source regions as well as the channel region are located, also referred to as the body, is dielectrically encapsulated. This configuration provides significant advantages, but also gives rise to a plurality of issues. Contrary to the body of bulk devices, which is electrically connected to the substrate and thus applying a specified potential to the substrate maintains the bodies of bulk transistors at a specified potential, the body of SOI transistors is not connected to a specified reference potential, and, hence, the body's potential may usually float due to accumulating minority charge carriers, unless appropriate countermeasures are taken.

A further issue in high performance devices, such as microprocessors and the like, is an efficient device-internal temperature management due to the significant heat generation. Due to the reduced heat dissipation capability of SOI devices caused by the buried insulating layer, the corresponding sensing of the momentary temperature in SOI devices is of particular importance.

Typically, for thermal sensing applications, an appropriate diode structure may be used wherein the corresponding characteristic of the diode may permit information to be obtained on the thermal conditions in the vicinity of the diode structure. The sensitivity and the accuracy of the respective measurement data obtained on the basis of the diode structure may depend significantly on the diode characteristic, i.e., on the diode's current/voltage characteristic, which may depend on temperature and other parameters. For thermal sensing applications, it may, therefore, typically be desirable to provide a substantially "ideal" diode characteristic in order to provide the potential for precisely estimating the temperature conditions within the semiconductor device. In SOI devices, a corresponding diode structure, i.e., the respective PN junction, is typically formed in the substrate material located below the buried insulating layer, above which is formed the "active" semiconductor layer used for forming therein the transistor elements. Thus, at least some additional process steps may be required, for instance for etching through the semiconductor layer or a corresponding trench isolation area and through the buried insulating layer in order to expose the crystalline substrate material. On the other hand, the process flow for forming the substrate diode is typically designed so as to exhibit a high degree of compatibility with the process sequence for forming the actual circuit elements, such as the transistor structures, without undue negative effects on the actual circuit elements.

In sophisticated semiconductor devices, there is an ongoing demand for reducing feature sizes of the circuit elements in order to enhance transistor performance and increase packing density of the device. Thus, respective process sequences including sophisticated lithography, etch, deposition, implantation, anneal and other process techniques may have to be frequently adapted or newly developed in order to obtain the desired gain in transistor performance. For example, in sophisticated applications, the drive current capability of MOS transistors may not only be increased by continuously reducing the gate length of the respective transistor devices but also by increasing the charge carrier mobility in the respective channel regions of the transistors. This may be accomplished by locally generating a corresponding strain in the channel region which may, if appropriately adapted to the crystallographic conditions in the channel region, result in an increase of electron mobility and hole mobility, respectively, thereby providing the potential for significantly enhancing the performance of P-channel transistors and N-channel transistors. Thus, a plurality of respective mechanisms have been developed in order to create the desired type of strain in respective transistor elements. For instance, semiconductor materials may be provided in the drain and source regions and/or within the channel region in order to obtain a specific slight lattice mismatch, which may result in an appropriate strain in the channel region. In other approaches, in addition or alternatively to the former mechanisms, highly stressed materials may be positioned in the vicinity of the channel region to induce a corresponding strain therein. For this purpose, frequently the contact etch stop layer, which is formed above the transistor element after completing the basic transistor structure, may be efficiently used since this layer is located close to the channel region and may be provided in the form of a dielectric material, such as silicon nitride, which may be efficiently deposited with a high intrinsic stress. Furthermore, respective deposition and patterning regimes have been developed by which locally different types of strain may be induced in different transistor elements.

In addition to or alternatively to strain-inducing mechanisms, many other process adaptations, for instance with respect to patterning strategies, implantation processes, anneal sequences and the like, may allow a significant improvement of the transistor performance but may have a detrimental effect on the substrate diode, which may prevent respective improvements with respect to transistor performance to be implemented in the overall process flow due to a significant deviation of the diode characteristic which would then significantly affect the sensing capability of the diode structure.

With reference to FIGS. 1a-1c, a typical process will now be described, in which a process sequence designed to enhance the transistor performance in the active semiconductor layer of an SOI device may have significant adverse effects on the diode structure formed in the substrate material, thereby significantly reducing production yield and thus profitability. In the example illustrated, the transistor performance may be improved by reducing the series resistance within the transistor and enhancing the stress transfer mechanism provided by a stressed dielectric layer formed above the transistor.

FIG. 1a schematically illustrates a cross-sectional view of a semiconductor device 100 representing an SOI device. The device 100 comprises a substrate 101 which includes, at least in an upper portion thereof, a substantially crystalline substrate material 102, which may be pre-doped in accordance with device requirements. For instance, the substrate material 102 may have incorporated therein a moderately low concentration of a P-type dopant. Furthermore, in an area of the substrate material 102 corresponding to a first device region 110, a respective counter-doped well 103 may be provided in which a corresponding substrate diode is to be formed. Furthermore, the semiconductor device 100 comprises a buried insulating layer 104, for instance comprised of silicon dioxide and the like, which separates a semiconductor layer 121 from the substrate material 102. The semiconductor layer 121 may represent a substantially crystalline semiconductor material, for instance silicon, silicon/germanium or any other appropriate silicon-based material for forming therein and thereon a plurality of circuit elements, such as transistors 130, which are illustrated at an early manufacturing stage. As shown, the transistors 130 may include respective gate electrodes 131 having formed on sidewalls thereof, in this manufacturing stage, a spacer 132, which may be designed to provide a desired offset during an implantation process for forming extension regions 134. Furthermore, the transistors 130 comprise a gate insulation layer 133 separating the gate electrode 131 from a channel region 135 formed in the semiconductor layer 121. Furthermore, in this manufacturing stage, an increased dopant concentration of a dopant species also provided within the channel region 135 may be positioned in the vicinity of the extension regions 134, wherein such increased dopant concentrations may also be referred to as halo regions 136, provided to obtain desired abrupt PN junctions after completing the transistor elements 130. Furthermore, respective isolation structures 105 in the form of trench isolations are provided in order to define specific areas in the first and second device regions 110, 120 wherein, for convenience, respective isolation structures 105, laterally bordering respective transistors 130, are not shown in the second device region 120. In the first device region 110, the isolation structures 105, in combination with a respective portion of the buried insulating layer 104, define respective openings 111A, 111B extending to the substrate material 102, i.e., an exposed portion of the well 103.

A typical process flow for forming the semiconductor device 100 as shown in FIG. 1a may comprise the following processes. After providing the substrate 101 and defining therein respective doped areas in the substrate material 102, such as the N-well 103, which may be accomplished on the basis of appropriate implantation sequences, the isolation structures 105 may be formed by using well-established photolithography, anisotropic etch, deposition and planarization techniques. It should be appreciated that, depending on the process strategy, the isolation structures 105 in the first device region 110 may be formed as a substantially continuous insulating portion or may expose respective semiconductor portions of the initial semiconductor layer 121. Next, the gate insulation layers 133 and the gate electrodes 131 may be formed on the basis of sophisticated oxidation and/or deposition techniques followed by the deposition of a gate electrode material, which may then be patterned on the basis of sophisticated lithography and respective etch processes. It should be appreciated that respective gate electrode materials may also be provided in the first device region 110 and may be patterned in accordance with device requirements. For convenience, any such patterned gate electrode materials, which may be used for providing intra-level interconnections are not shown in FIG. 1 a. Next, the spacer 132 may be formed on the basis of oxidation and/or deposition techniques and subsequently respective implantation processes, such as pre-amorphization implants, a halo implantation and the like, may be performed, thereby providing the halo regions 136. It should be appreciated that respective implantation processes have to be performed differently for transistors of different conductivity types. That is, respective resist masks may be provided prior to a specific ion implantation process in order to prevent unwanted dopant species from being introduced into specific transistor elements. For example, during the halo implantation, a P-type dopant may be introduced into the active region of an N-channel transistor, while respective P-channel transistors are covered by a resist mask. Next, a further implantation sequence may be performed in order to provide the extension regions 134, wherein the spacers 132 provide the desired offset to the channel region 135. Thereafter, the openings 111A, 111B may be formed on the basis of appropriate anisotropic etch techniques using a resist mask for etching through the material of the semiconductor layer 121 or through the material of the isolation structure 105, when provided as a substantially continuous area within the first device region 110. Furthermore, the corresponding etch process is designed to etch through the buried insulating layer 104 and exposing material of the N-well 103.

FIG. 1b schematically illustrates a cross-sectional view of the semiconductor device 100 in a further advanced manufacturing stage. The transistors 130 may have formed a sidewall spacer structure 136 and respective deep drain and source regions 137. Similarly, a respective sidewall structure 116 may be formed within the openings 111A, 111B and corresponding heavily doped regions 117A, 117B may be formed in the N-well 103.

In order to provide a high degree of compatibility of the process of forming the substrate diode structure in the first device region 110, with respect to the further processing of the transistors 130, the respective manufacturing processes are performed in the first and second device regions 110, 120 in a common process sequence. Thus, the sidewall spacer structure 136 may be formed on the basis of well-established spacer techniques, i.e., by depositing an appropriate material layer or layer stack and patterning the corresponding layer by anisotropic etch techniques. Thus, the layer is also deposited within the openings 111A, 111B, thereby resulting in the sidewall spacer structure 116 after the anisotropic etch process. Next, the deep drain and source regions 137 may be formed by a corresponding ion implantation sequence, for instance by first covering P-type transistors in the second device region 120 and also covering the opening 111B and introducing an N-type dopant, thereby obtaining the deep drain and source regions 137 of the N-channel transistors and also obtaining the heavily doped region 117A. Thereafter, a corresponding implantation process may be performed on the basis of a P-dopant species. Next, respective anneal sequences may be performed to activate the dopants and also to re-crystallize implantation-induced damage in the drain and source regions 137 and the heavily doped regions 117A, 117B.

As previously explained, several mechanisms may be implemented in order to improve transistor performance in the second device region 120. For instance, the series resistance in the respective transistors 130 may be reduced by placing a corresponding metal silicide to be formed in the drain and source regions 137 more closely to the channel region. Thus, the spacer structure 136 may be removed prior to a respective silicidation process, wherein additionally a stressed dielectric material may also be formed more closely to the channel region after the silicidation process.

FIG. 1c schematically illustrates the semiconductor device 100 with respective metal silicide regions 138 formed in the respective transistors 130 with a reduced lateral offset with respect to the channel regions 135. Similarly, respective metal silicide regions 118 may also be formed in the doped regions 117A, 117B. Prior to the respective silicidation process, the spacer structure 136 may be removed on the basis of well-established etch techniques, wherein the spacer structures 116 are also removed. However, after the removal of the spacer structures 116, the formation of the respective metal silicides 118 may be highly critical, since the characteristics of a substrate diode 140, defined by the PN junction of the region 117B and the N-well 103, are substantially determined by the dopant concentration in the vicinity of the PN junction. During the preceding manufacturing sequence, a certain overlap of the regions 117A, 117B with the corresponding material of the buried insulating layer 104 may have been created, in particular in the P-doped region 117B due to dopant diffusion during the corresponding anneal processes. However, since the metal silicide regions 118 are formed without the spacer structure 116 (see FIG. 1b), the remaining overlap 119 of the P-type dopant of the area 117B with buried insulating layer 104 may provide only a small process margin for the silicidation process, which may even result in a shortage of the respective PN junction due to the migration of metal silicide into the lightly N-doped well 103. Even if a corresponding shortage may not occur, the resulting characteristics of the PN junction may nevertheless significantly depend on the process specifics of the silicidation process, since the distance of the respective metal silicide region 118 with respect to the PN junction in the areas 119 may vary and therefore also affect the corresponding diode characteristics. Furthermore, during the silicidation process, which may require the deposition of a refractory metal, cleaning processes may typically be performed, which may damage the corresponding sidewalls of the openings 111A, 111B thereby possibly further reducing an overlap between the P-doped region 117B and the corresponding insulating material of the layer 104 in the area 119. Consequently, the substrate diode 140 may have to be formed on the basis of significantly reduced process margins, when a corresponding process sequence for enhancing the performance of the transistors 130 is performed. It should be appreciated that a corresponding "shortage" in the region 117A is less critical since the behavior of the substrate diode 140 is substantially defined by the PN junction defined by the N-well 103 and the region 117B.

Thus, the performance gain obtained by the reduced series resistance in the transistors 130 and by the close proximity of a stressed dielectric layer 139, for instance in the form of a silicon nitride layer, may be obtained at the cost of reduced reliability of the substrate diode 140. As a result, the conventional process technique for forming the substrate diode 140 may suffer from reduced process margins with respect to process variations in forming high performance transistor elements.

The present disclosure is directed to various methods and systems that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques for forming substrate diodes in SOI devices, wherein a high degree of compatibility with process strategies for forming respective transistor elements may be maintained while nevertheless providing increased process margins when implementing transistor performance increasing mechanisms. In some aspects, an increased process stability and thus stability in diode characteristics may be achieved by appropriately coordinating the processes for forming respective openings for the substrate diode and the manufacturing sequence of respective transistor elements in order to reduce the dependence of diode characteristics on respective performance enhancing measures. By appropriately defining the point of the entire process flow at which the manufacturing process for the substrate diode is started and progresses in parallel with the manufacturing process of the transistor devices, additional process steps with respect to the conventional strategy, as previously described, may substantially be avoided. Thus, any reduction in throughput may be prevented while nevertheless production yield may be increased due to the increased process margin during the formation of the substrate diode. In other aspects, an additional offset within respective diode openings may be provided without affecting the remaining device areas, wherein well-established process techniques may be used. Consequently, also in this case, a significant improvement with respect to process robustness and transistor performance may be obtained without unduly contributing to process complexity.

One illustrative technique disclosed herein comprises forming a first opening and a second opening in a first device region of an SOI device while covering a second device region, wherein the first and second openings extend through a buried insulating layer to a crystalline substrate material, while the second device region has formed therein a first transistor and a second transistor each comprising an extension region. Furthermore, the method comprises forming drain and source regions in the first transistor and a first doped region in the crystalline substrate material that is exposed by the first opening, wherein the drain and source regions and the first doped region are formed in a common first drain/source implantation process. Furthermore, drain and source regions in the second transistor and a second doped region in the crystalline substrate material exposed by the second opening are formed in a common second drain/source implantation process. Finally, a metal silicide is formed in the first and second transistors and the first and second doped regions.

Another illustrative technique disclosed herein comprises forming a spacer layer in a first opening located in a first device region of an SOI device and forming the spacer layer above a first transistor formed in a second device region, wherein the first opening extends through a buried insulating layer to a crystalline substrate material. Thereafter, a spacer element is formed on a portion of sidewalls of the first opening while removing the spacer layer from above the first transistor. Finally, a metal silicide is formed in the first transistor and the crystalline substrate material exposed by the first opening having formed therein the spacer element.

Yet another illustrative technique disclosed herein comprises forming a first opening and a second opening for a substrate diode, wherein the first and second openings extend through a buried insulating layer separating a crystalline substrate material from a crystalline semiconductor layer. Ion species are implanted through the first and second openings into the crystalline substrate material during at least one implantation process sequence performed to form drain and source regions of transistors formed in the semiconductor layer. Furthermore, an offset spacer is locally formed in the first and second openings and a metal silicide is formed in the doped crystalline substrate material at the first and second openings on the basis of the offset spacer.

BRIEF DESCRIPTION OF THE DRAWINGS

The disclosure may be understood by reference to the following description taken in conjunction with the accompanying drawings, in which like reference numerals identify like elements, and in which.

Figure 1A:
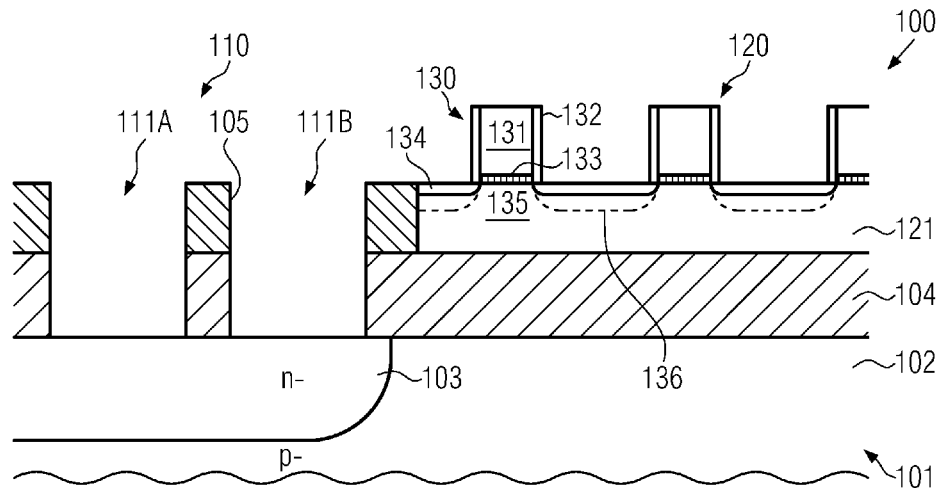
FIGS. 1a-1c schematically illustrate cross-sectional views of an SOI device during various manufacturing stages, wherein a substrate diode is formed in accordance with manufacturing techniques for enhancing transistor performance of respective field effect transistors.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to a technique for manufacturing a substrate diode in advanced SOI devices, wherein an increased process robustness may be achieved by appropriately starting the manufacturing sequence for the substrate diode within the process flow for manufacturing transistor elements and/or providing additional design measures, such as offset spacers, which may not unduly affect the manufacturing sequence in device areas for forming transistor structures. Consequently, the respective diode characteristics may be influenced less by variations and adaptations required in the manufacturing sequence for enhancing the transistor performance of sophisticated SOI devices. Thus, respective improvements in the process flow may be implemented substantially without significant influence on the sensing behavior of the respective substrate diodes, thereby providing enhanced flexibility in designing and manufacturing advanced integrated circuits. Consequently, in some aspects of the present disclosure, the silicidation process in the substrate diode and the respective transistor elements, although performed as a common manufacturing sequence, may be efficiently decoupled from each other with respect to a corresponding silicide offset from critical device areas, thereby providing the potential for efficiently reducing the series resistance in the transistor devices and also providing an enhanced stress transfer mechanism while reducing the risk of shorting the PN junction in the substrate diode. In some illustrative embodiments, the corresponding robustness in forming respective metal silicide regions may be accomplished on the basis of an efficient process flow substantially without requiring any additional process steps compared to conventional strategies, thereby substantially not contributing to additional process complexity. In still other illustrative embodiments, respective offset spacers may be provided in the substrate diode at any appropriate manufacturing stage, while substantially not affecting the transistor structures. The corresponding offset spacers may be formed on the basis of well-established techniques, thereby providing the potential for avoiding other and typically more complex process strategies for enhancing the process robustness in forming substrate diodes in SOI devices. Hence, also in this case, production costs may be reduced.

Figure 2A:
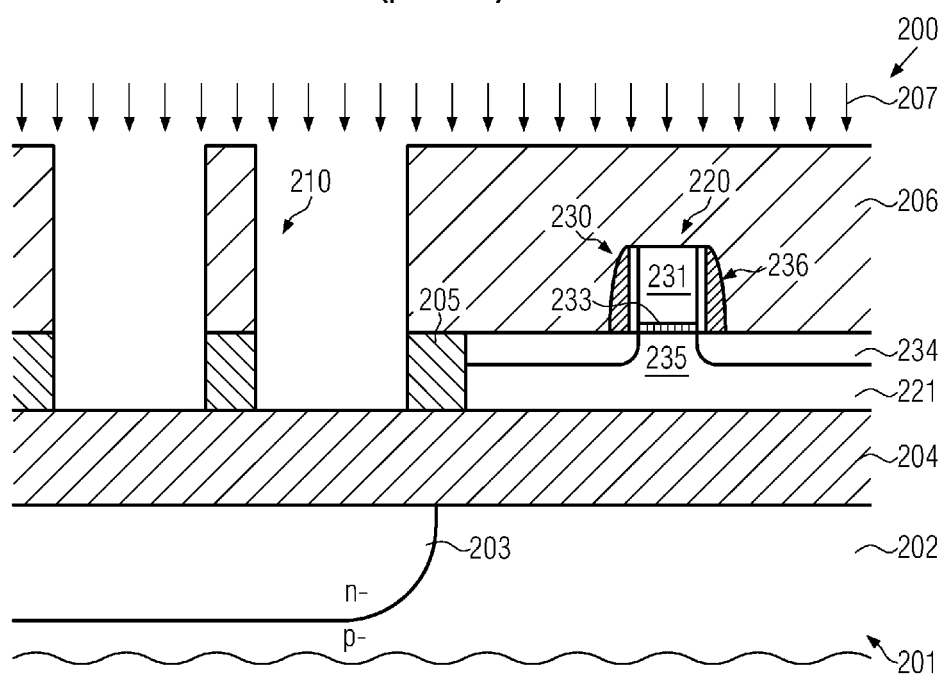
FIGS. 2a-2e schematically illustrate cross-sectional views of an SOI device during various manufacturing stages in forming a substrate diode according to a manufacturing technique for improving transistor performance while additionally providing increased process margins for the substrate diode according to illustrative embodiments.

FIG. 2a schematically illustrates a cross-sectional view of a semiconductor device 200, which may comprise, at least partially, an SOI configuration. That is, the semiconductor device 200 may comprise, at least in a significant portion thereof, a substrate 201 having formed thereon a substantially crystalline substrate material 202, which may represent a silicon-based material, that is, a material comprising a significant amount of silicon to enable the creation of a metal silicide therein. Furthermore, a buried insulating layer 204, such as a silicon dioxide layer or any other appropriate material, may be formed above the substrate material 202 in order to separate a silicon-based semiconductor layer 221 from the substrate material 202. Thus, the semiconductor layer 221, in combination with the buried insulating layer 204 and the substrate material 202, may represent, in an initial manufacturing stage, an SOI configuration, while it should be appreciated that, in other device areas of the device 200, a substantially bulk-like configuration may be provided, depending on the device requirements.

The semiconductor device 200 may further comprise a first device region 210, in and above which a corresponding substrate diode is to be formed, and a second device region 220 comprising a plurality of circuit elements, such as field effect transistors, wherein, for convenience, a single transistor 230 is illustrated in FIG. 2a. The transistor 230 may comprise a gate electrode 231 formed on a respective gate insulation layer 233 which separates the gate electrode 231 from a channel region 235 formed in the semiconductor layer 221. Furthermore, respective extension regions 234 may be formed within the layer 221, and a sidewall spacer structure 236 may be formed on sidewalls of the gate electrode 231. The spacer structure 236 may be designed to provide a desired lateral offset for a further ion implantation process to be performed in a later stage in order to form respective deep drain and source regions in the semiconductor layer 221. It should be appreciated that the spacer structure 236 may comprise a plurality of individual spacer elements, which may have been formed intermittently with respective implantation processes, when highly sophisticated lateral dopant profiles are required. In one illustrative embodiment, the spacer structure 236 may represent a structure as required for the final implantation sequence in order to define the finally desired dopant profile, except for any subsequent anneal processes and the corresponding dopant diffusion that may be associated therewith. Furthermore, within the second device region 220, any isolation structures 205 may be provided in order to border respective active areas of transistor elements of different conductivity type and the like in accordance with device requirements. For convenience, a single isolation structure 205 is shown, which may act as a vertical border to separate the first and second device regions 210, 220. Furthermore, in the manufacturing stage shown, an etch mask 206 may be provided and may cover the second device region 220, while exposing respective areas of the first device region 210, in which openings for exposing the substrate material 202 for forming a substrate diode therein are to be formed. In the embodiment shown, a respective N-well may be located in the substrate material 202 corresponding to the first device region 210. Hence, in the embodiment shown in FIG. 2a, the transistor 230 is provided in a manufacturing stage, where the spacer structure 236 for defining the drain and source regions are already present, while the corresponding substrate material 202 in the first device region 210 has been protected by the buried insulating layer 204 and the semiconductor layer 221 or by the isolation structure 205, when provided as a substantially continuous portion in the first device region 210.

A typical process flow for forming the semiconductor device 200 as shown in FIG. 2a may comprise the following processes. The N-well region 203 may be formed in accordance with well-established techniques. Thereafter, the circuit elements in the second device region 220, such as the transistor 230, may be formed on the basis of appropriate process techniques, as are for instance described with reference to the semiconductor device 100 as shown in FIG. 1a, or any other appropriate process strategies. That is, appropriate dopant profiles may be formed in the semiconductor layer 220, for instance after the formation of the isolation structures 205, in order to adjust certain transistor characteristics, such as threshold voltage and the like. Next, the gate electrode 231, the gate insulation layer 233 and respective offset spacer structures may be formed in accordance with respective known process strategies, followed by implantation sequences, for instance comprising pre-amorphization implants, halo implants as described with reference to FIG. 1a, and finally respective implantation processes for forming the extension regions 234, may be performed. As previously explained, the halo implantation and the extension implantation have to be performed according to a specific masking regime to provide the desired dopant species in the various transistor types formed in the second device region 220. Thereafter, the spacer structure 236 may be formed, for instance by depositing an appropriate etch stop layer followed by a spacer layer, which may then be anisotropically etched in order to provide respective sidewall spacers. It should be appreciated that two or more individual spacer elements may be formed in the structure 236, wherein respective implantation processes may be performed intermittently in order to provide a complex dopant profile, if required. Next, the mask 206 may be formed on the basis of photolithography, thereby exposing a portion of the layer 221 in which respective openings extending to the substrate material 202 in the first device region 210 are to be formed. The device 200 may then be subjected to an etch process 207, which may be performed on the basis of an appropriate etch chemistry for etching through the layer 221 or through the isolation structures 205, when the layer 221 has been replaced by insulating material during a corresponding process sequence for forming the isolation structures 205. Furthermore, the etch process 207 may be designed to etch through the buried insulating layer 204 (see FIG. 2b) to finally expose respective portions of the N-well 203, thereby preparing or starting the process sequence for forming a substrate diode in the substrate material 202, i.e., the N-well 203.

Figure 1B:
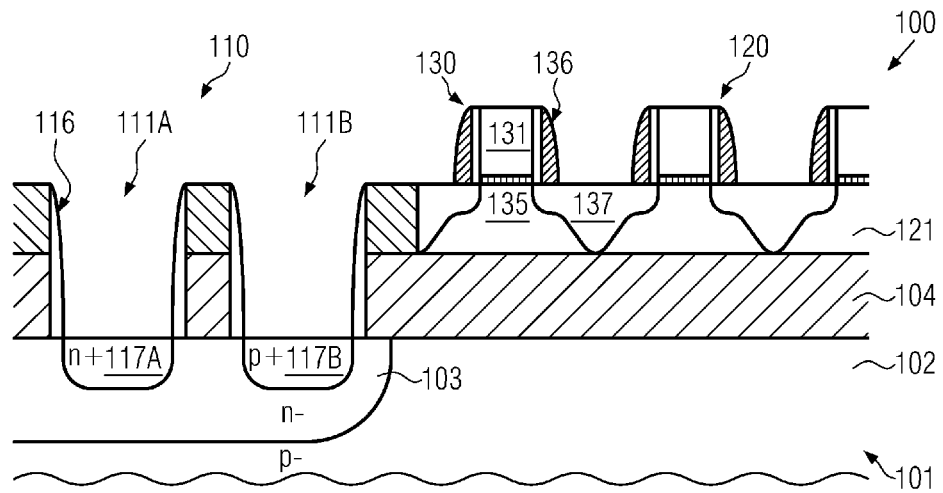
Figure 1C:
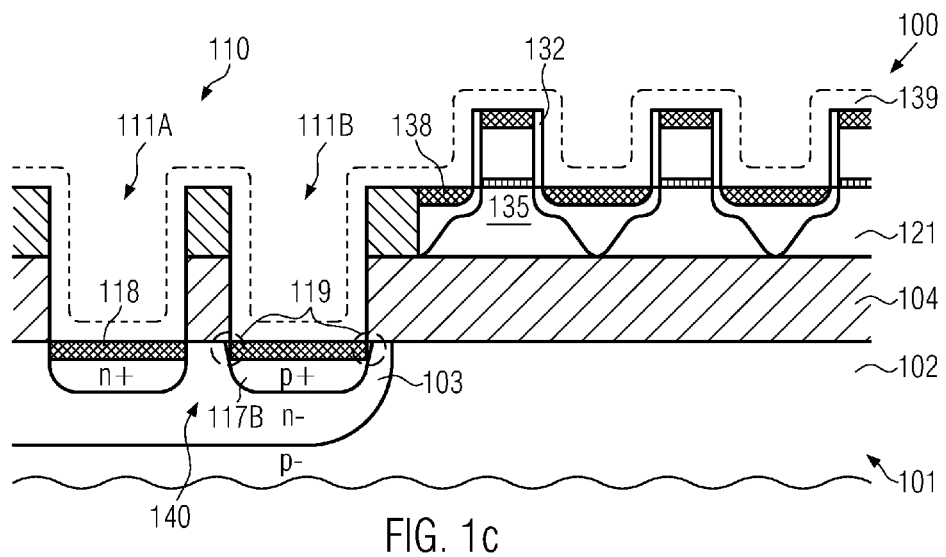
Figure 2B:
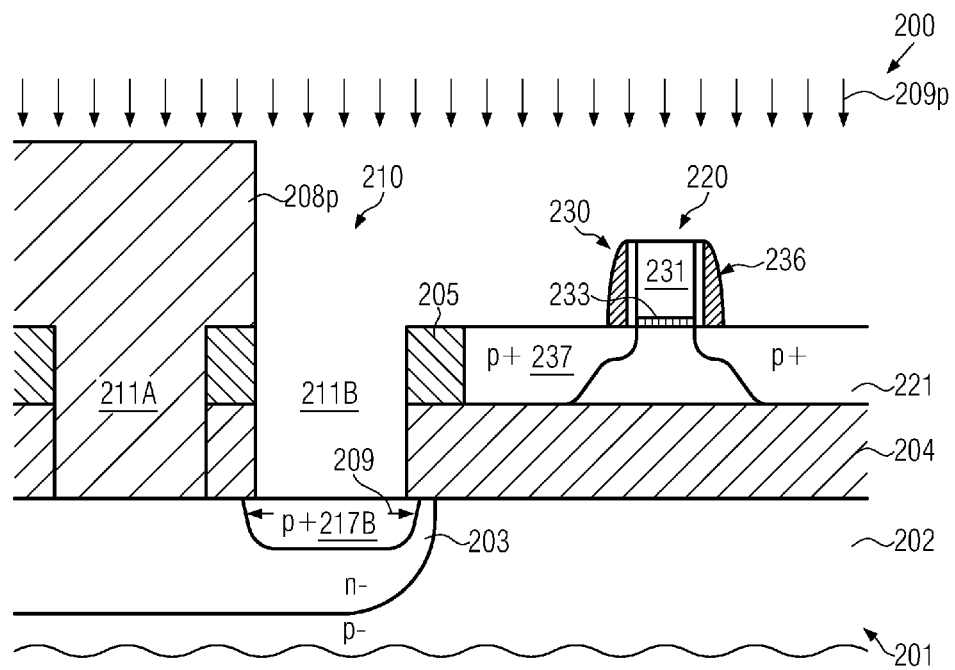

FIG. 2b schematically illustrates the semiconductor device 200 in a further advanced manufacturing stage. Respective openings 211A, 211B are formed in the first device region 210 in order to expose the substrate material 202 for forming a respective substrate diode therein. Furthermore, in this manufacturing stage, a respective implantation mask 208p is provided, which may expose portions of the second device region 220, i.e., the transistor 230, to an ion implantation process 209p in order to introduce a dopant species required for forming respective drain and source regions 237. In the illustrative embodiment shown, the implantation 209p may introduce a P-type dopant, such as boron and the like, when the transistor 230 represents a P-channel transistor. During the implantation process 209p, a respective dopant species is also introduced in the exposed substrate material 202, thereby forming a respective heavily doped region 217B. Typically, the implantation process 209p is designed for obtaining a desired dopant profile for the drain and source regions 237, wherein, due to any preceding implantation processes such as a pre-amorphization, a moderately sharp profile may be obtained on the basis of the sidewall spacer structure 236 which may be highly desirable in view of enhanced transistor performance, since here moderately abrupt PN junctions may enhance the controllability and the drive current capability of the device 230. On the other hand, the high crystalline quality of the exposed substrate material 202 in the opening 211B may result in a significant lateral deflection of the incoming ions, in particular if boron is considered, thereby resulting in a significant lateral distribution of the dopant distribution, wherein, due to missing sidewall spacers, as are typically provided in the conventional approach described with reference to FIGS. 1a-1c, the corresponding dopant species may also be positioned laterally under the respective sidewall portions of the opening 211B, as indicated by arrows 209.

Figure 2C:
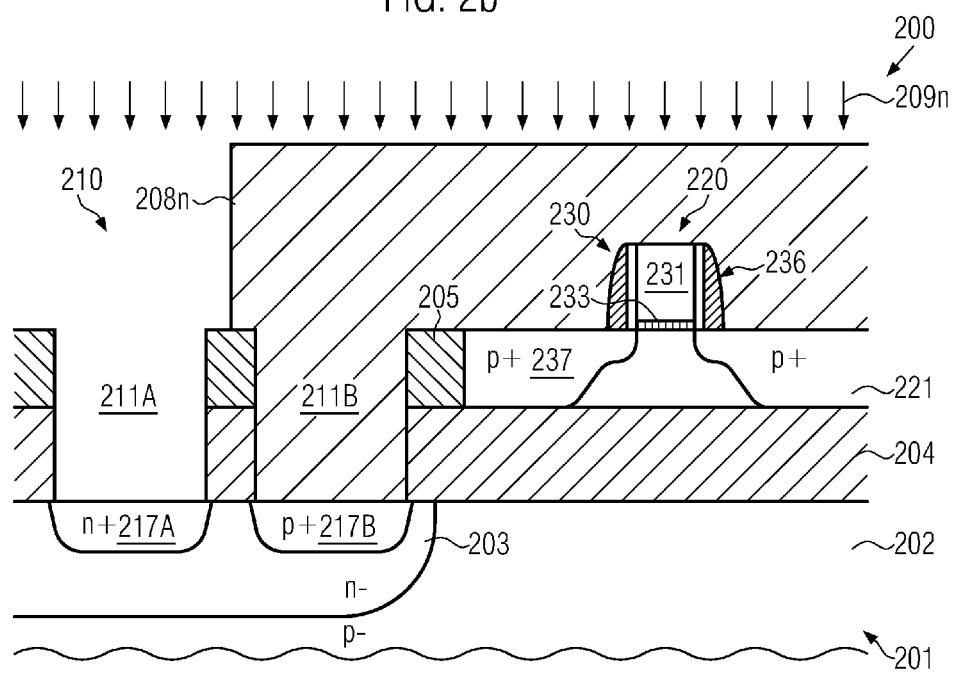

FIG. 2c schematically illustrates the semiconductor device 200 during a subsequent implantation process 209n performed on the basis of a further resist mask 208n which may cover any P-type transistors, such as the transistor 230, and expose N-type transistors (not shown) and may also expose the opening 211A. Consequently, a corresponding highly doped region 217A may be formed within the N-well 203.

Figure 2D:
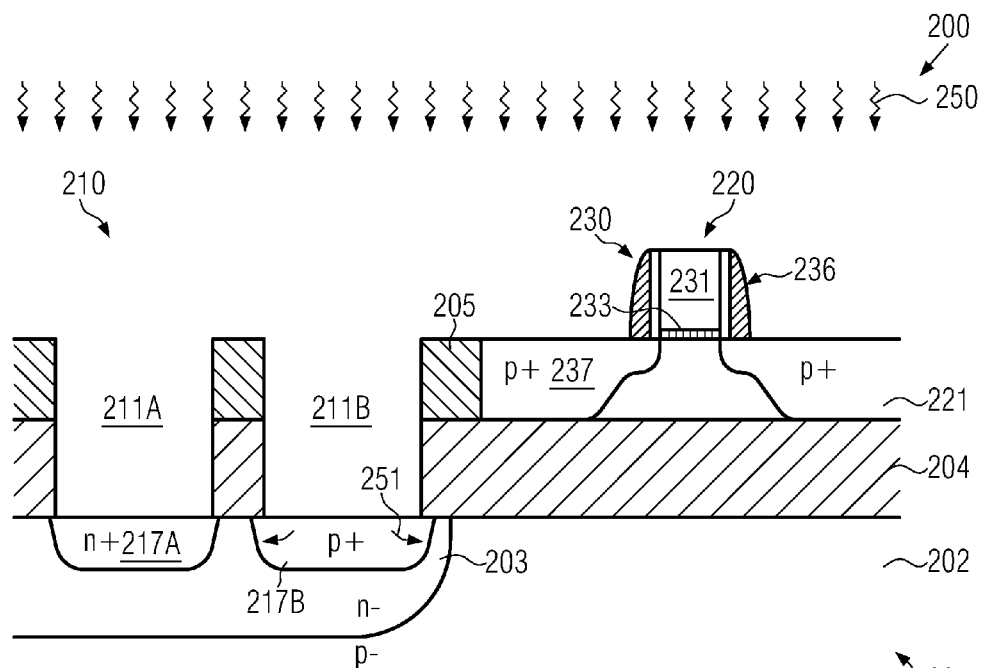

FIG. 2d schematically illustrates the semiconductor device 200 during an anneal process 250 that is performed to activate the dopant species and re-crystallize implantation-induced damage. For example, the anneal process 250 may result in a further diffusion of the dopants, in particular of the P-type dopants in the region 217B, as typically boron may have an increased diffusivity compared to N-dopant species. During the anneal process 250, a corresponding dopant diffusion in the drain and source regions 237 may be significantly reduced compared to the region 217B due to the highly damaged or even substantially amorphized condition of the crystalline material in the regions 237. On the other hand, the desired increased diffusion activity in the significantly lesser damaged crystalline material of the region 217B may provide an enhanced overlap with the insulating material of the buried insulating layer 204, as indicated by arrows 251. Consequently, moderately sharp PN junctions may be maintained in the transistor 230, while the corresponding dopant gradient between the N-well 203 and the region 217B may be reduced, thereby providing enhanced diode characteristics and also enhanced robustness with respect to process variations during the subsequent manufacturing processes. It should be appreciated that the anneal process 250 may comprise sophisticated techniques on the basis of radiation pulses generated by laser-based or flashlight-based systems. Consequently, in such regimes, the dopant diffusion may be significantly reduced or may be substantially completely eliminated, thereby also providing enhanced transistor characteristics in the device 230. In this case, the corresponding diffusion activity in the region 217B may also be significantly reduced or eliminated wherein, however, the corresponding lateral distribution of the dopant species during the preceding implantation process 209p may nevertheless provide significant improvement with respect to process robustness. In other illustrative embodiments, a corresponding sophisticated anneal process may be preceded by an anneal process performed based on a moderately low temperature which may allow the dopants in the region 217B to efficiently diffuse, while substantially suppressing any significant diffusion activity in the substantially amorphized drain and source regions 237.

Figure 2E:
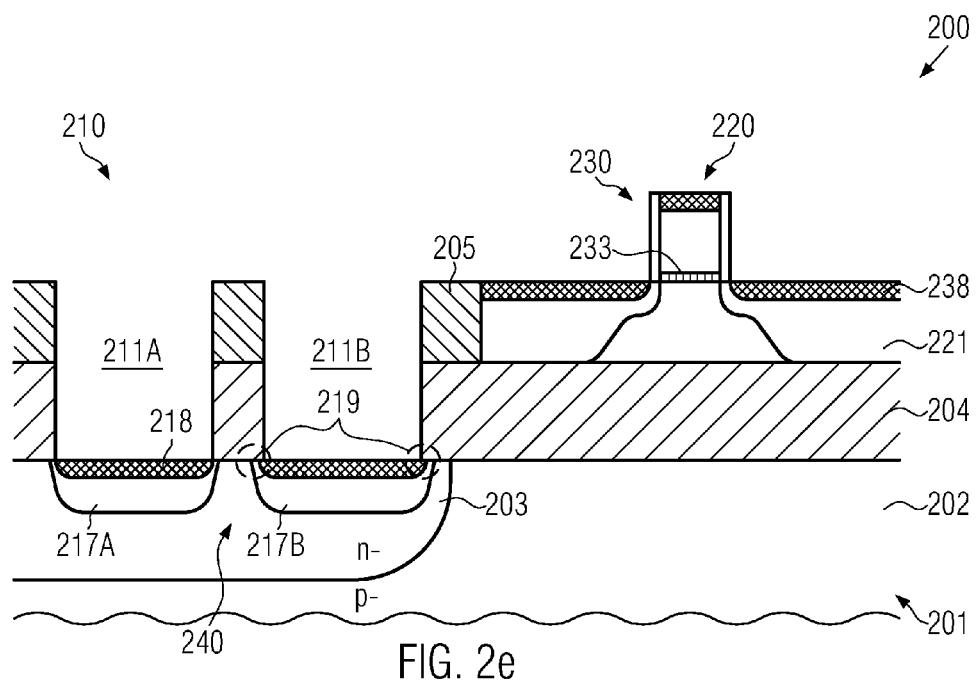

FIG. 2e schematically illustrates the semiconductor device 200 in a further advanced manufacturing stage. In the embodiment illustrated in FIG. 2e, a substrate diode 240 is defined by the PN junction formed by the region 217B and the N-well 203, while the region 217A may substantially act as a contact area for the diode 240. Moreover, respective metal silicide regions 218 are provided in the diode 240 and respective metal silicide regions 238 may also be formed in the transistor device 230. In the illustrated embodiment, the metal silicide regions 238 in the drain and source regions 237 may be formed with a reduced offset with respect to the channel region 235, which may be accomplished by removing the respective spacer structure 236, as is also previously described with reference to the device 100. That is, the spacer structure 236, which may be comprised of silicon nitride, may be removed selectively to a corresponding liner material (not shown), which may, for instance, be comprised of silicon dioxide and which may at least cover the sidewall portions of the gate electrode 231. During the corresponding highly selective etch process, the corresponding sidewalls of the openings 217A, 211B may exhibit a high etch selectivity when formed from silicon dioxide. Hence, the corresponding overlap 219 of the region 217B may be substantially maintained. In the subsequent cleaning processes performed prior to the deposition of a refractory metal, the increased overlap 219 may also provide sufficient process margins with respect to an erosion of the sidewalls of the opening 211B. Consequently, the metal silicide region 218 may be formed with a significantly reduced probability to negatively affect the dopant concentration in the area 219, thereby providing enhanced stability of the diode characteristics, without causing a corresponding shortage of the PN junction in the region 217B. Thus, the characteristics of the substrate diode 240 may remain relatively stable, irrespective of any process variations during the silicidation process.

Thereafter, the further processing may be continued, for instance by depositing a highly stressed dielectric material, such as a stressed contact etch stop layer and the like, to further enhance the performance of the transistor 230. For example, a dielectric layer of high intrinsic compressive stress may be formed above the transistor 230, as is for instance described with reference to FIG. 1c, while a corresponding dielectric material of high tensile stress may be formed above respective N-channel transistors (not shown). For this purpose, silicon nitride layers may be deposited on the basis of appropriately selected process parameters, which may provide the desired type and magnitude of intrinsic stress, wherein appropriate patterning regimes may be used for selectively providing the various dielectric materials over different types of transistors. Thus, the process flow as described above may exhibit a high degree of compatibility with conventional strategies and may even be performed without any additional process steps while nevertheless providing a high degree of decoupling of the diode characteristics from respective silicidation regimes.

With reference to FIGS. 3a-3f, further illustrative embodiments will now be described, in which an increased offset of metal silicide regions with respect to a PN junction of a substrate diode may be provided on the basis of additional spacer elements substantially without affecting the manufacturing sequence for transistor devices.

Figure 3A:
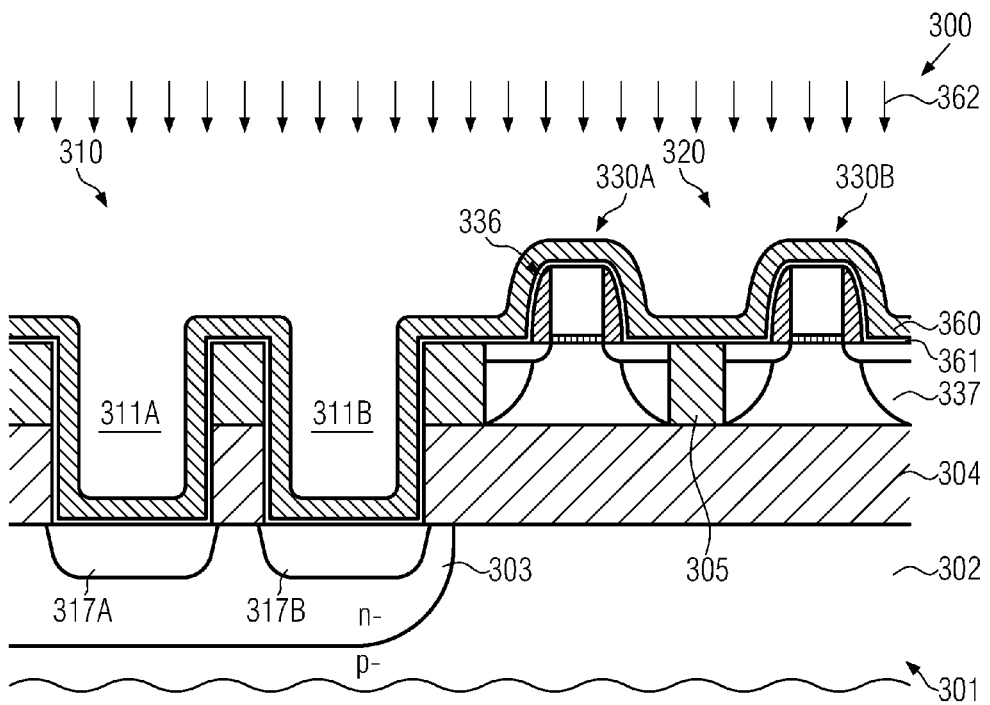
FIGS. 3a-3f schematically illustrate cross-sectional views of an SOI device during various manufacturing stages, wherein a substrate diode is formed on the basis of sacrificial spacer elements according to further illustrative embodiments.

FIG. 3a schematically illustrates a semiconductor device 300 comprising at least a portion that represents an SOI configuration. The device 300 may thus comprise a substrate 301, a substrate material 302, a buried insulating layer 304 and a semiconductor layer 321, at least in a second device region 320, while the first device region 310 may comprise respective openings 311A, 311B. The second device region 320 may comprise a plurality of circuit elements, such as a first transistor 330A and a second transistor 330B, which may represent transistors of different conductivity type and the like. For example, the transistors 330A, 330B may be separated in the lateral direction by respective isolation structures 305, which may also be provided in the first device region 310. Furthermore, in this manufacturing stage, the transistors 330A, 330B may have formed therein respective drain and source regions 337 and similarly respective heavily doped regions 317A, 317B may be formed in the substrate material 302, which may also comprise a respective well region 303. It should be appreciated that for the components described so far the same criteria apply as previously described with reference to the device 200. Furthermore, the device 300 may comprise, in this manufacturing stage, a spacer layer 360 conformally formed within the openings 311A, 311B and above the second device region 320, i.e., the transistors 330A, 330B. Furthermore, an etch stop layer may be conformally formed below the spacer layer 360. The layers 360 and 361 may be formed by any appropriate materials, such as silicon nitride, silicon dioxide and the like, as long as a sufficiently high etch selectivity between these two layers may be obtained.

The semiconductor device 300 may be formed on the basis of the following processes. The transistors 330A, 330B and the openings 311A, 311B may be formed on the basis of a manufacturing sequence, as is for instance described with reference to the device 200. That is, the openings 311A, 311B may be formed after forming respective sidewall spacer structures 336 used for defining the drain and source regions 337, thereby avoiding the formation of any spacers at sidewalls of the openings 311A, 311B. As will be described later on with reference to FIGS. 3d-3f, in other embodiments, respective sidewall spacers may also be provided in the openings 311A, 311B prior to depositing the layer stack 360, 361. With respect to any manufacturing techniques, it may be referred to the device 200. Thus, the respective doped regions 317A, 317B may be formed during respective implantation sequences for defining the drain and source regions 337 of the transistors 330A, 330B. The etch stop layer 361 may be deposited, for instance on the basis of plasma enhanced chemical vapor deposition (PECVD) or any other appropriate deposition technique. Next, the spacer layer 360 may be deposited, for instance by PECVD, wherein similar process recipes may be used as are also applied when forming the spacer structure 336. Thereafter, the device 300 is subjected to an anisotropic etch process 362 based on an etch chemistry exhibiting a high etch selectivity with respect to the etch stop layer 361. For example, well-established etch recipes are available for silicon nitride and silicon dioxide. The anisotropic etch process 362 may first remove the material of the layer 360 at horizontal surface portions, similar as in respective spacer etch processes, wherein the process 362 may be continued so as to also remove any vertical material residues in the second device region 320. Since a significant height difference exists between the height dimension of the openings 311A, 311B and the corresponding gate electrodes 331, a significant portion of the material of the layer 360 may still remain at sidewall portions within the openings 311A, 311B, even after the layer 360 is substantially completely removed from the second device region 320. Thereafter, any minute residues of the layer 360 may be removed on the basis of wet chemical etch recipes, which may not significantly affect the remaining portions within the openings 311A, 311B.

Figure 3B:
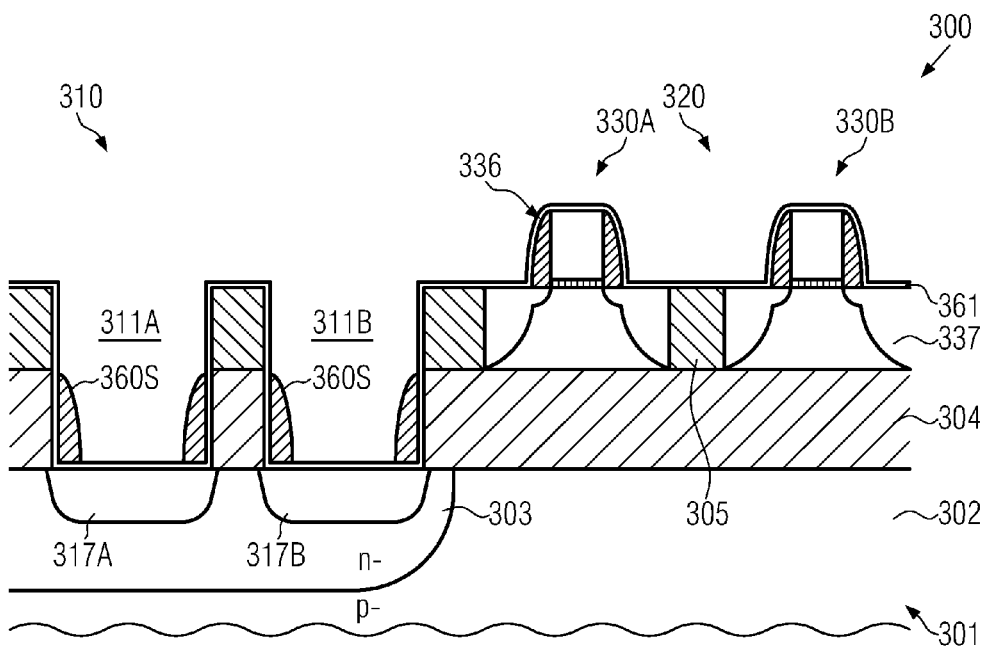

FIG. 3b schematically illustrates the semiconductor device 300 after the above-described etch process 362. Hence, respective offset or sacrificial spacers 360S are provided within the openings 311A, 311B, thereby providing a reduced width at the bottom of the respective openings. Next, the etch stop layer 361 may be removed, for instance on the basis of any appropriate wet chemical processes or dry etch processes, depending on the device strategy.

Figure 3C:
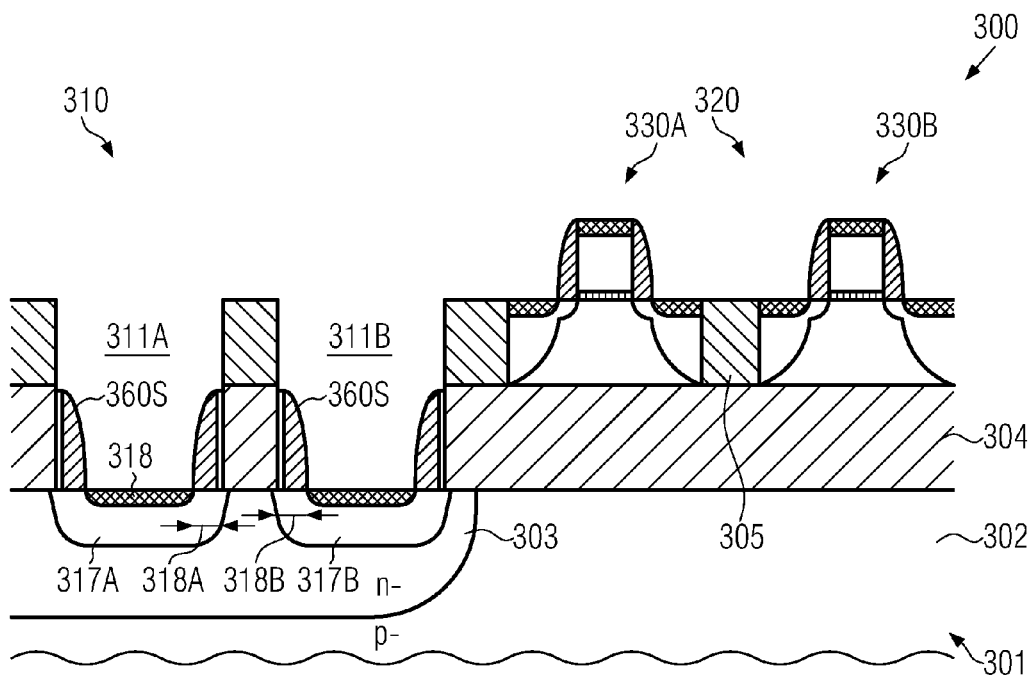

FIG. 3c schematically illustrates the semiconductor device 300 in a further advanced manufacturing stage. Here, respective metal silicide regions 318 are formed in the openings 311A, 311B while respective metal silicide regions 338 are formed in the transistors 330A, 330B. Due to the additional offset spacers 360S, respective increased offsets 318B, 318A are obtained, thereby significantly enhancing the stability of diode characteristics with respect to any process adaptations and variations.

Figure 3D:
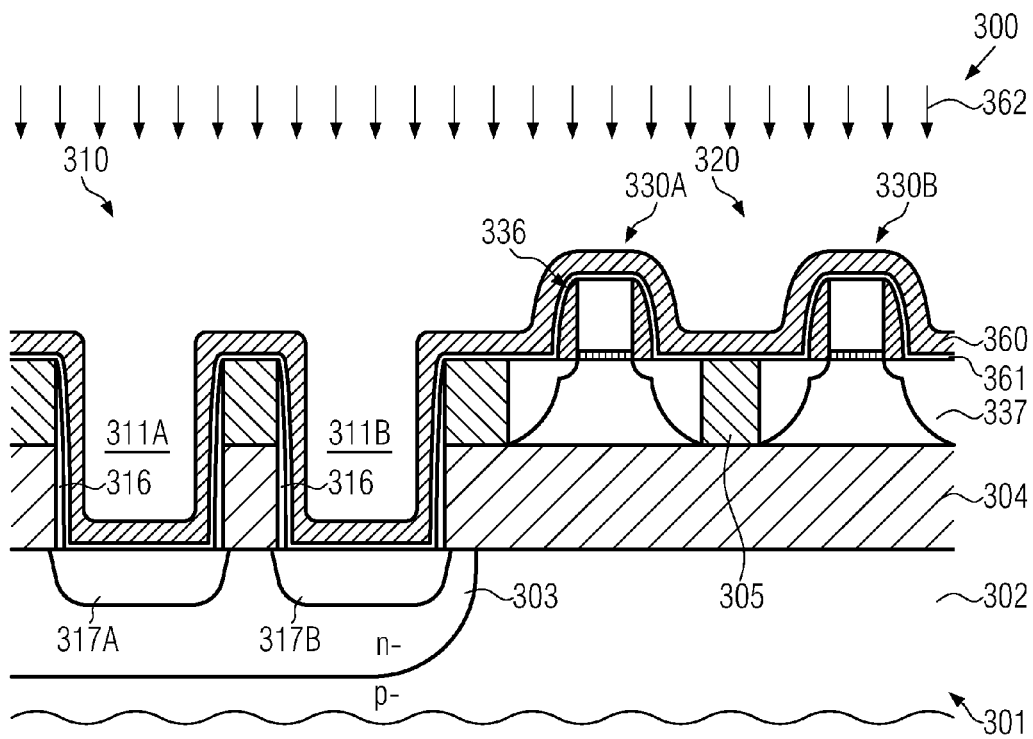

FIG. 3d schematically illustrates the semiconductor device 300 according to further illustrative embodiments. In these embodiments, a sidewall spacer structure 316 may be formed on sidewalls of the respective openings 311A, 311B, wherein the sidewall spacer structure 316 may be formed in accordance with the spacer structure 336 in the first device region 320. That is, the openings 311A, 311B may have been formed at any appropriate manufacturing stage, for instance after forming respective extension regions for the transistors 330A, 330B, as is for instance described with reference to the device 100 when referring to the conventional process flow. In other illustrative embodiments, the openings 311A, 311B may have been formed prior to the corresponding extension implantation, if a more pronounced gradient in dopant concentration may be desired in the doped regions 317A, 317B. For example, after forming the openings 311A, 311B, a respective extension implantation may be performed, thereby depositing a corresponding dopant concentration at the vicinity of the sidewalls of the openings 311A, 311B. Thereafter, the spacer structures 316 and 336 may be formed in a common manufacturing sequence, which may also involve intermediate dopant implantations when sophisticated dopant profiles are required in the drain and source regions 337. In this way, a laterally increasing dopant gradient from the sidewalls towards the center of the regions 317A, 317B may be obtained. Thereafter, the spacer layer 360 and the etch stop layer 361 may be deposited, as previously described, and may be removed on the basis of the etch process 362, as previously described.

Figure 3E:
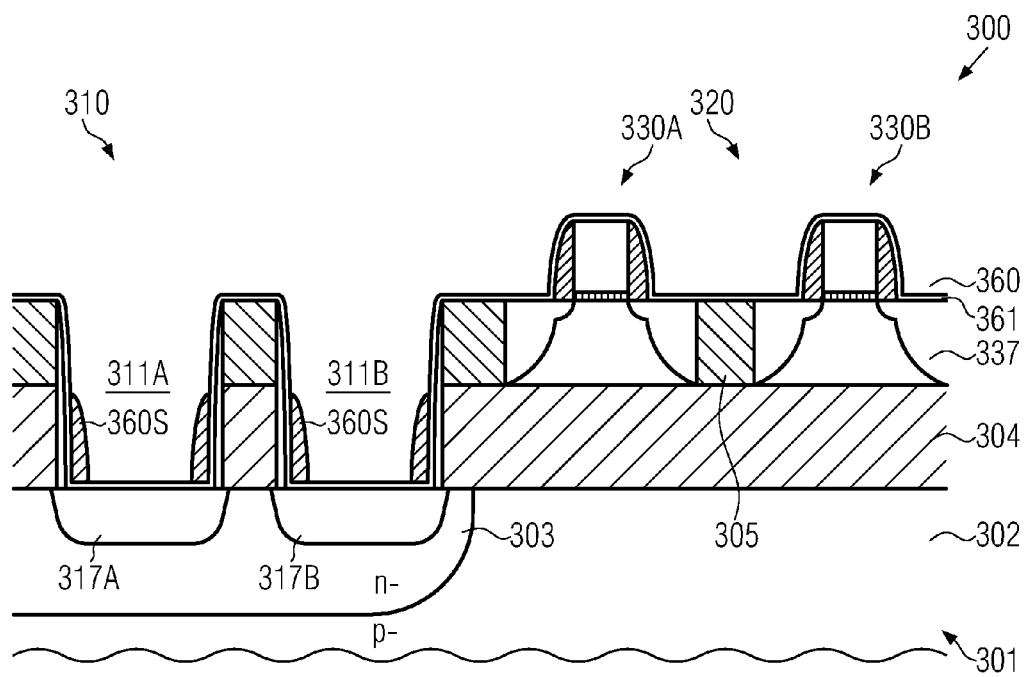

FIG. 3e schematically illustrates the semiconductor device 300 after the etch process 362, wherein the layer 360 is substantially completely removed from above the second device region 320, thereby forming the offset spacers 360S. Thus, during a subsequent silicidation process, the spacers 360S may provide additional process margins with respect to any process variations, while additionally the lateral dopant gradient may provide enhanced diode characteristics of the substrate diode 340. It should be appreciated that, with respect to any anneal processes, the same criteria apply as previously explained with reference to the device 200. That is, sophisticated anneal techniques may be used, wherein a significant dopant diffusion may be suppressed. Hence, in this case, the additional spacers 360S may nevertheless provide a desired profiling of the dopant gradient in the regions 317A, 317B which may be more pronounced compared to the drain and source regions 336, since the corresponding implantation species may be incorporated into a substantially crystalline material compared to a substantially amorphized material in the second device region 320, as is previously explained.

After removing the etch stop layer 361, the further processing may be continued by forming respective metal silicide regions, as previously described. In other illustrative embodiments, the spacer structure 336 in the second device region 320 may be removed prior to performing the silicidation sequence, wherein the spacers 360S may also be removed while nevertheless maintaining, at least partially, the previously formed spacers 316. Hence, also in this case, a sufficient offset of the corresponding metal silicide regions may be maintained while nevertheless providing a reduced series resistance in the transistors 330A, 330B due to the reduced offset of the corresponding metal silicide regions, as is also described with reference to the device 200.

Figure 3F:
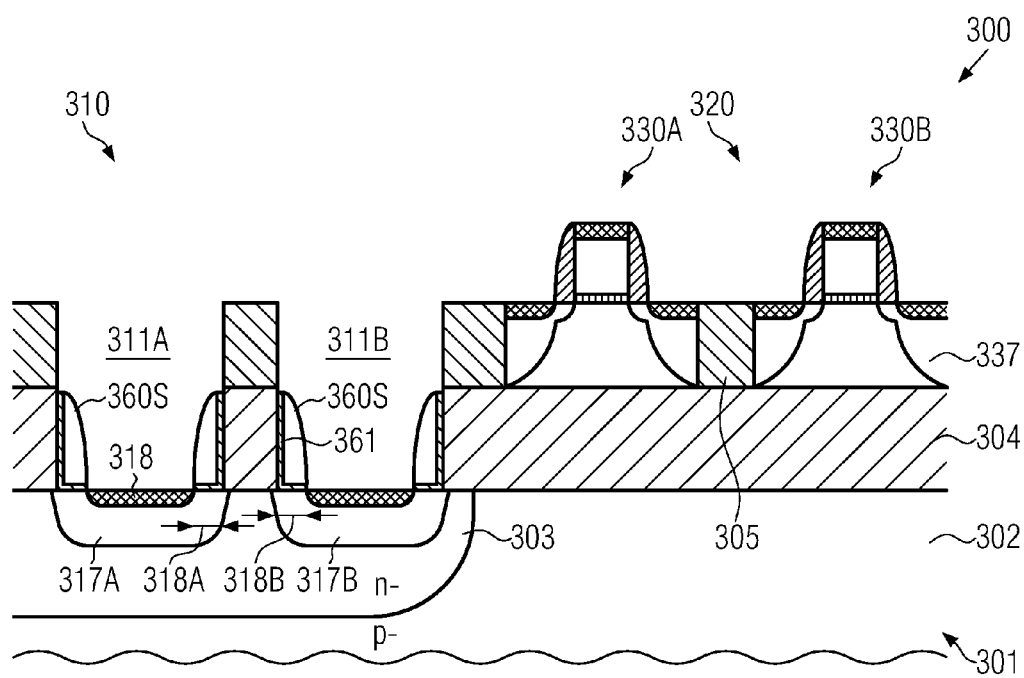

FIG. 3*f* illustrates the semiconductor device 300 in accordance with yet another illustrative embodiment, in which the offset spacer 360S may be provided on the basis of an appropriate material composition so as to exhibit a moderately high etch selectivity with respect to the sidewall spacer structure 336. For example, the spacer 360S may be comprised of silicon dioxide and the etch stop layer, i.e., the residue thereof 361, may be provided in the form of a silicon nitride material. Consequently, during the formation of the spacer 360S, the silicon dioxide material may be selectively removed with respect to the layer 361 substantially without affecting the sidewall spacer structures 336 in the second device region 320. Thereafter, the spacer structures 336 may be removed to enhance the transistor performance prior to the silicidation process, wherein the spacers 360S may be substantially maintained due to the respective etch selectivity during the removal of the spacers 336. Consequently, during the subsequent silicidation process, a desired high offset may be obtained in the regions 317A, 317B while positioning the corresponding metal silicide regions close to the channel region in the transistors 330A, 330B. Thereafter, the further processing may be continued, for instance by adding stressed overlayers above the transistor elements 330A, 330B, thereby further enhancing the overall transistor performance.

As a result, the subject matter disclosed herein provides a technique for enhancing process robustness and stability of characteristics of a substrate diode formed in an SOI portion of a semiconductor device, in that respective manufacturing strategies for enhancing the transistor performance may not substantially negatively impact the diode characteristics. In some aspects, respective openings for the substrate diode may be formed immediately prior to the last implantation for forming the drain and source regions, thereby providing increased lateral distribution of dopants in the substrate diode and thus increased process robustness, while, in other aspects, additionally or alternatively, offset spacers may be provided that may substantially not affect the transistor structures. Consequently, process adaptations aimed at improvements for transistor performance may readily be implemented without requiring additional process complexity and thus causing potential throughput and yield loss.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a spacer layer in a first opening located in a first device region of an SOI substrate, above a first transistor formed in a second device region, and on sidewalls of said first transistor, said first opening extending through a buried insulating layer to a crystalline substrate material;
   forming a first spacer element on a portion of sidewalls of said first opening from said spacer layer while substantially completely removing said spacer layer from above said first transistor and from said sidewalls; and
   forming a metal silicide in said first transistor and said crystalline substrate material exposed by said first opening having said first spacer element.

2. The method of claim 1, further comprising forming a first doped region in said crystalline substrate material exposed by said first opening prior to forming said first spacer element.

3. The method of claim 2, wherein said first doped region and drain and source regions of said first transistor are formed in a common implantation process.

4. The method of claim 3, further comprising forming a sidewall spacer structure on sidewalls of a gate electrode of said first transistor prior to forming said first opening.

5. The method of claim 1, further comprising removing a sidewall spacer formed on sidewalls of a gate electrode of said first transistor prior to forming said metal silicide.

6. The method of claim 1, wherein said sidewall spacer of said gate electrode is removed prior to forming said spacer layer.

7. The method of claim 1, further comprising forming a second opening in said first device region and a second transistor in said second device region prior to forming said spacer layer, said second transistor representing a transistor of a conductivity type other than said first transistor, said method further comprising forming a second doped region in said crystalline substrate material exposed by said second opening and drain and source regions of said second transistor in a common implantation process.

8. The method of claim 1, further comprising forming a first stress-inducing layer above said first transistor and a second stress-inducing layer above said second transistor after forming said metal silicide, said first and second stress-inducing layers having different types of intrinsic stress.

9. The method of claim 1, further comprising:
   forming an etch stop layer above said first transistor and lining said first opening prior to forming said spacer layer; and
   removing said spacer layer from above said first transistor using said etch stop layer.

10. The method of claim 2, further comprising forming a second spacer element on said sidewalls of said opening and a third spacer element on sidewalls of a gate electrode of said first transistor prior to forming said spacer layer, wherein said first doped region is formed in the presence of said second spacer element.

11. The method of claim 2, further comprising forming a second doped region in said crystalline substrate material exposed by said first opening using said first spacer element as an implantation mask.

12. The method of claim 11, wherein said first doped region and drain and source regions of said first transistor are formed in a first common implantation process, and the method further comprises forming said second doped region and a second portion of said drain and source regions in a second common implantation.

13. The method of claim 1, further comprising forming extension regions of said first transistor prior to forming said first opening.

14. The method of claim 4, further comprising:
forming extension regions of said first transistor prior to forming said first opening; and
forming said sidewall spacer structure on said sidewalls of said gate electrode after forming said extension regions.

15. The method of claim 1, further comprising forming extension regions of said first transistor and a first doped region in said crystalline substrate material exposed by said first opening prior in a first common implantation process.

16. The method of claim 15, further comprising forming a second doped region in said crystalline substrate material exposed by said first opening after forming said first spacer element.

17. The method of claim 16, further comprising forming a first portion of drain and source regions of said first transistor and said second doped region in a second common implantation process.

18. The method of claim 17, further comprising forming a sidewall spacer structure on sidewalls of a gate electrode of said first transistor prior to forming said first portion of drain and source regions.

19. The method of claim 18, further comprising forming a third doped region in said crystalline substrate material exposed by said first opening in the presence of said sidewall spacer structure prior to forming said first spacer element.

20. The method of claim 19, further comprising forming said third doped region and a second portion of said drain and source regions in a third common implantation process prior to said second common implantation process.

* * * * *